US012601060B2

(12) United States Patent
May

(10) Patent No.: US 12,601,060 B2
(45) Date of Patent: Apr. 14, 2026

(54) SUBSTRATE RECEIVING AREA FOR PROCESS CHAMBERS

(71) Applicant: CemeCon AG, Würselen (DE)

(72) Inventor: Walter May, Aachen (DE)

(73) Assignee: CemeCon AG, Würselen (DE)

( * ) Notice: Subject to any disclaimer, the term of this patent is extended or adjusted under 35 U.S.C. 154(b) by 913 days.

(21) Appl. No.: 17/790,716

(22) PCT Filed: Dec. 16, 2020

(86) PCT No.: PCT/EP2020/086351
§ 371 (c)(1),
(2) Date: Jul. 1, 2022

(87) PCT Pub. No.: WO2021/139977
PCT Pub. Date: Jul. 15, 2021

(65) Prior Publication Data
US 2023/0040661 A1     Feb. 9, 2023

(30) Foreign Application Priority Data

Jan. 7, 2020     (DE) ..................... 10 2020 100 171.1

(51) Int. Cl.
*C23C 16/458*          (2006.01)
*C23C 16/513*          (2006.01)

(52) U.S. Cl.
CPC ...... *C23C 16/4587* (2013.01); *C23C 16/4581* (2013.01); *C23C 16/513* (2013.01)

(58) Field of Classification Search
CPC .......... B65G 2249/02; H01L 21/67724; H01L 21/67173
See application file for complete search history.

(56) References Cited

U.S. PATENT DOCUMENTS 3,623,707 A * 11/1971 Klopp ................... B66F 7/0608
                                                     187/269
4,744,712 A     5/1988 Mitchell
                        (Continued)

FOREIGN PATENT DOCUMENTS

CN          202358880 U  *  8/2012
CN          107337140 A  * 11/2017 ................ B66F 3/12
                        (Continued)

OTHER PUBLICATIONS

English Machine Translation of Ge (CN202358880U) retrieved from ESPACENET Apr. 4, 2025 (Year: 2025).*
(Continued)

*Primary Examiner* — Parviz Hassanzadeh
*Assistant Examiner* — Laureen Chan
(74) *Attorney, Agent, or Firm* — Christensen O'Connor Johnson Kindness PLLC

(57)          ABSTRACT

The present disclosure relates to a device for holding workpieces in a process chamber. The present disclosure additionally relates to a coating system and to a method for coating a workpiece. In order to allow for precise adjustment of the height of the position of workpieces while supporting same in a secure and stable manner, the holding device includes a platform for the workpieces, a height-adjustable first support element and a height-adjustable second support element for the platform, wherein each of the support elements has at least one first and one second limb element, wherein the respective first and the respective second limb element are coupled so as to be pivotable relative to one another about a pivot axis, and wherein the pivot axis of the first support element is arranged at an angle to the pivot axis of the second support element.

15 Claims, 8 Drawing Sheets

(56) References Cited

U.S. PATENT DOCUMENTS

Figure 1:
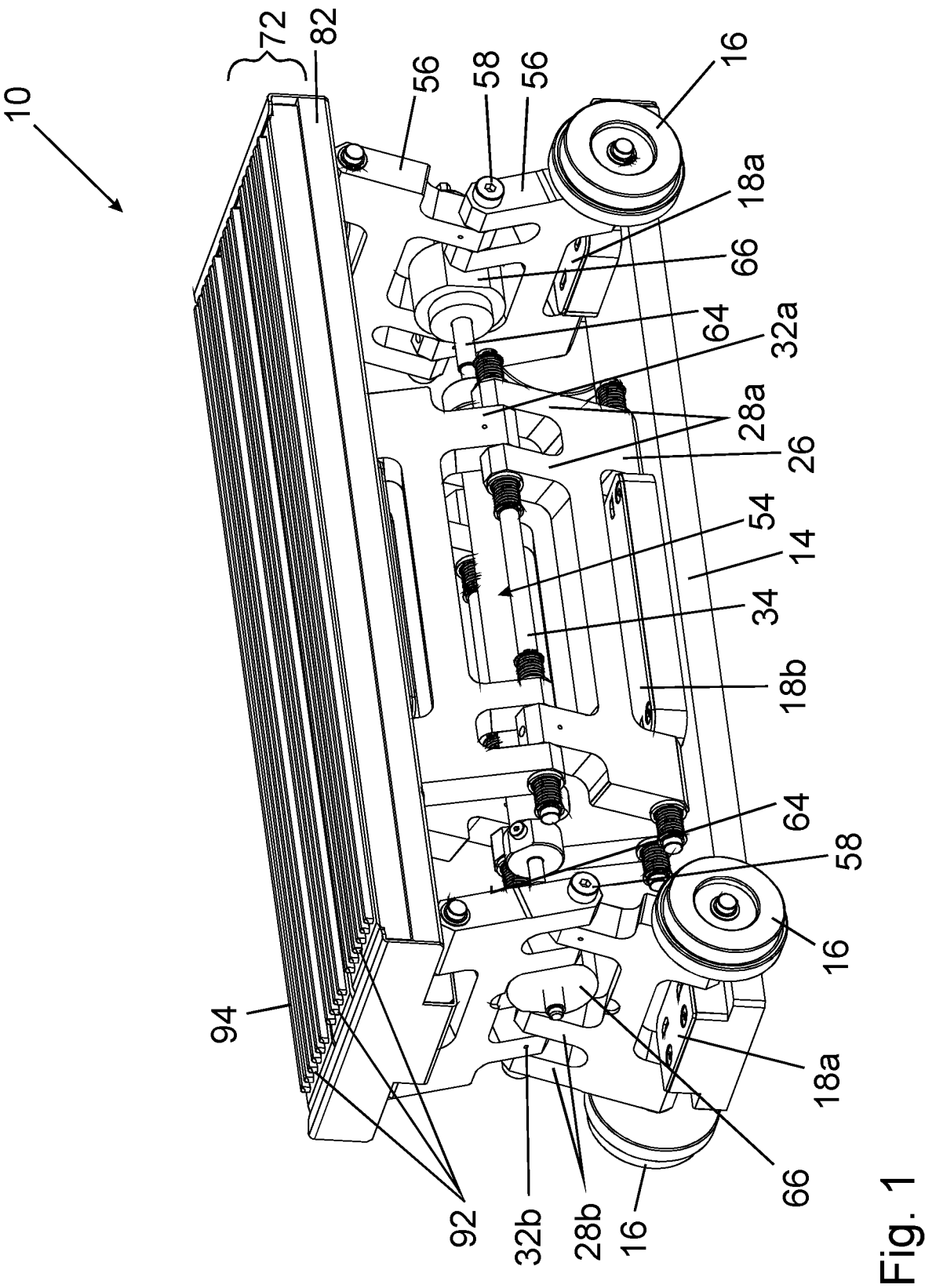

| | | | | |
|---|---|---|---|---|
| 4,981,215 | A | 1/1991 | Ilic | |
| 4,981,408 | A | 1/1991 | Hughes et al. | |
| 5,421,889 | A | 6/1995 | Pollock et al. | |
| 6,251,191 | B1 * | 6/2001 | Matsuse | H01L 21/67069 156/345.31 |
| 2004/0255867 | A1 * | 12/2004 | Ulrich | H01J 37/32678 118/723 MW |
| 2009/0200527 | A1 * | 8/2009 | Christie | B66F 3/12 254/122 |
| 2009/0211879 | A1 | 8/2009 | Milner et al. | |
| 2010/0243163 | A1 * | 9/2010 | Ino | B65G 49/061 156/345.31 |
| 2011/0076118 | A1 | 3/2011 | Kurita et al. | |
| 2012/0031335 | A1 * | 2/2012 | Kurita | C23C 16/54 118/723 R |
| 2013/0291798 | A1 | 11/2013 | Lee et al. | |
| 2014/0014854 | A1 | 1/2014 | Hertel et al. | |
| 2015/0034893 | A1 | 2/2015 | Bacon et al. | |
| 2019/0071776 | A1 * | 3/2019 | Boguslavsky | C23C 16/402 |

FOREIGN PATENT DOCUMENTS

| | | | | |
|---|---|---|---|---|
| CN | 108622817 | A | 10/2018 | |
| CN | 109019409 | A | 12/2018 | |
| DE | 101 56 615 | A1 | 5/2003 | |
| DE | 10 2009 010 280 | A1 | 8/2009 | |
| DE | 20 2011 106 761 | U1 | 8/2012 | |
| WO | WO-2013088706 | A1 * | 6/2013 | ......... C23C 16/4584 |
| WO | 2020/001718 | A1 | 1/2020 | |

OTHER PUBLICATIONS

English Machine Translation of Ichikawa (WO2013088706A1) retrieved from ESPACENET Apr. 11, 2025 (Year: 2025).*

English Machine Translation of Fu (CN-107337140-A) retrieved from ESPACENET May 13, 2025 (Year: 2024).*

International Search Report and Written Opinion mailed Jun. 22, 2021, issued in corresponding Application No. PCT/EP2020/086351, filed Dec. 16, 2020, 11 pages.

* cited by examiner

SUBSTRATE RECEIVING AREA FOR PROCESS CHAMBERS

The invention relates to a device for holding workpieces in a process chamber. The invention additionally relates to a coating system and to a method for coating a workpiece.

Devices for holding workpieces are used to receive workpieces such that they are held in a particular position in a process chamber. For example, workpieces can be held in coating systems such as CVD or PVD systems so as to be subjected to a coating method.

Devices for holding workpieces are known in various designs from the prior art.

DE 10156 615 B4 discloses a substrate holding table which comprises a tabletop having a scissors mechanism. The substrate holding table can be displaced or rotated in various directions.

The object can be considered that of providing a device for holding workpieces, a coating system herewith, and a method for coating a workpiece, wherein precise adjustment of the height of the position of workpieces is made possible while said workpieces are supported in a secure and stable manner.

The invention solves this object by means of a device for holding workpieces according to claim 1, a coating system according to claim 11, and a method according to claim 14. Advantageous developments of the invention are set forth in the respective dependent claims.

The device according to the invention for holding workpieces comprises a platform for the workpieces, a height-adjustable first support element and a height-adjustable second support element for the platform, wherein each of the support elements comprises at least one first and one second limb element, wherein the respective first and the respective second limb element are coupled so as to be pivotable relative to one another about a pivot axis, and wherein the pivot axis of the first support element is arranged at an angle to the pivot axis of the second support element.

The platform may also be designed differently. For example, the platform may be designed such that it provides a region that can receive a workpiece so as to hold same in a given position. In order to ensure a high degree of flexibility, such that a large number of different workpieces can be held by the platform, the platform may preferably be designed to be substantially planar, such that a workpiece-specific holder with the workpiece can be positioned thereon, for example. Furthermore, the platform area may additionally comprise holding means for the workpiece-specific holders, for example notches or grooves.

The platform is arranged on a first and a second support element. The support elements are designed to be able to hold the platform in a given position in a stable manner. In this connection, the support elements are designed to be adjustable in height in order to allow the platform to change its position in a height direction. Said height direction should be understood to mean a distance direction between the platform and a boundary arranged therebelow, for example a floor of a process chamber. In the following, the boundary arranged below the platform is referred to as the standing surface without limitation to particular embodiments. Typically, in this context, the height direction is oriented perpendicularly to the standing surface and, preferably, a substantially planar platform is also oriented perpendicularly to the height direction.

The two support elements each comprise a first and a second limb element. The respective first and second limb element serve to enable an adjustment of the height of the corresponding support element. For this purpose, the limb elements are arranged at a variable pivot angle to one another. A change in the pivot angle thus changes the height of the entire support element comprising both limb elements. For this purpose, the limb elements may preferably be designed to be rigid. They are pivotably coupled in the region of the pivot axis, for example in a common connection section, and can move about the pivot axis, preferably independently of one another, and can thus change the pivot angle. The pivotable coupling enables a continuous adjustment of the pivot angle and, as a result, a continuous height adjustment. The pivot axis may be defined by a straight line about which the limb elements carry out rotation movements. In addition, the pivot axis may be designed as a shaft element, such that the limb elements enclose the shaft element in their connection section.

The first and the second support element are positioned relative to one another such that the pivot axis of the first support element is arranged at an angle to the pivot axis of the second support element. Said arrangement at an angle makes it possible to support the platform in at least two directions. A rotation of the platform, for example about the first pivot axis, can be prevented by means of the support element having the second pivot axis. The angle may be an acute or an obtuse angle. Preferably, the pivot axes are arranged at a right angle to one another, such that each support element is oriented perpendicularly to movements permitted by the other support element.

The device according to the invention for holding workpieces makes it possible, in a particularly reliable manner, to hold the workpiece in a secure and stable manner. The support elements each prevent movements of the platform, and thus of the workpiece, toward some degrees of freedom. The arrangement of the pivot axes at an angle advantageously increases the confinement of the movement, since the confinement of the movement caused by the first support element overlaps with that caused by the second support element. At the same time, the height adjustability is maintained, such that a workpiece, for example in a coating system, can be positioned accordingly inside a process chamber for a coating method. The height of the platform can then be adapted individually for workpieces of different sizes, for example.

The height adjustability of the first and/or second support element may be designed differently. According to an advantageous development, the first and/or second support element comprises an adjustment element, which is designed to change the height of the support element. For this purpose, the adjustment element may cause a movement of the support element, for example. The adjustment element may act on the entire support element or on an individual component, for example a limb element. Preferably, the adjustment element may comprise a drive, which may be designed as a linear or rotary drive. For example, a rotary drive may be a crank or a motor, and a linear drive may be a push rod or a traction cable and preferably a spindle drive.

In order to adjust the height, for example, the adjustment element may displace the first limb element and the second limb element against or into one another such that the total height of the support element is changed. In a preferred embodiment, the adjustment element is designed to change a pivot angle between the first and second limb element. For this purpose, the adjustment element may, for example, be coupled to the first and/or second limb element in order to pivot same about the pivot axis and thus in order to change their position relative to one another.

In another advantageous embodiment, the adjustment element is designed to displace the pivot axis transversely to a height direction. The direction oriented transversely to the height direction may be understood to be the adjustment direction and may thus preferably be oriented horizontally. Preferably, when the pivot axis is shifted, the ends of the limb elements that are spaced apart from the pivot axis substantially remain unmoved in the adjustment direction. More preferably, the ends of the limb elements are connected in an articulated manner to the platform and, particularly preferably, in an articulated manner to the standing surface as well. As a result, a change in the pivot angle can also lead to a change in the angle between the limb element and the platform and/or between the limb element and the standing surface. In this way, the platform can change its height while its orientation is maintained, such that it remains aligned in parallel with the standing surface, for example.

In a preferred embodiment, the first and/or second support element comprises at least one axial spring element for applying a force effect in the direction of its pivot axis. The axial spring element may preferably be attached to a shaft element arranged along the pivot axis. The axial spring element may be designed as a torsion, bending, tension or compression spring, and is preferably a compression spring. As a helical spring, the axial spring element can advantageously by arranged around the shaft element. The axial spring element may preferably be arranged so as to act between the limb element and the shaft element in that it abuts the limb element on the one hand and a first locking element on the shaft element on the other hand. Preferably, the limb element is also clamped between the axial spring element and, for example, a second locking element on the shaft element. In this way, the axial spring element can act on the limb element, preferably with its spring force, in order to reduce backlash between the limb element and the shaft element by means of preloading and to bestow inertia upon the movements of the limb element by means of additional frictional forces. In this way, the stability of the platform can be improved. Furthermore, it may be advantageous for the support element to comprise multiple axial spring elements for applying a force effect. For example, at least two axial spring elements may act in opposite directions on the limb element and clamp same. On account of the opposing force effects of multiple axial spring elements, backlash, in particular in the axial direction, can particularly advantageously be reduced between the first and/or second limb element and the shaft element.

In a preferred embodiment, a cone element is arranged around the pivot axis, wherein the axial spring element acts on the cone element. The cone element is preferably arranged between the axial spring element and the limb element, such that the axial spring element acts in the axial direction on the cone element on the one hand and the cone element centers the limb element and the shaft element relative to one another on the other hand. The axial spring element may be attached on the shaft element next to the cone element in the axial direction and abut the cone element. Preferably, the cone element comprises a locking notch, which receives one end of the axial spring element and thus effects secure and centered positioning of the axial spring element on the cone element. The limb element may preferably comprise a conical bore, which receives the cone element at least partially in a form-fitting manner, such that the limb element and the cone element can abut one another as backlash-free as possible. In this way, the cone element centers the force effect of the axial spring element on the limb element, such that backlash between the limb element and the shaft element in the radial and axial direction is reduced to a particular degree. Particularly preferably, at least two cone elements are arranged between the limb element and one axial spring element in each case, such that the cone shapes are directed opposite one another in a mirror-symmetrical manner and the axial spring elements and cone elements apply force to the limb element from two opposing sides. Furthermore, it is preferable for the cone element to surround the shaft element with close fit, such that friction bestows inertia upon the relative movements between the cone element and shaft element.

According to a preferred development, only the first support element comprises the adjustment element for adjusting the height of the platform. The second support element may preferably follow the movements defined by the first support element. More preferably, the second support element may comprise damping elements for damping the movement, for example in order to apply preload.

According to an advantageous development, a shaft element is arranged along the pivot axis, wherein a radial spring element is arranged so as to act between the first and/or second limb element and the shaft element in radial manner. The radial spring element reduces backlash between the limb element and the shaft element in the radial direction by means of preloading and generates an additional frictional force that results in a higher inertia of the movement of the limb element relative to the shaft element. Additionally, the radial spring element reduces. The radial spring element may be designed as a torsion, bending, tension or compression spring, and is preferably a compression spring. It may, for example, be attached between the first and/or second limb element and the shaft element. Preferably, the radial spring element is arranged partially or preferably completely in a bore in the limb element. Particularly preferably, a radial spring element is in each case fitted between the first limb element and the shaft element and between the second limb element and the shaft element, such that backlash can additionally be avoided in the radial direction for the entire support element.

In an advantageous exemplary embodiment, the first limb element is fork-shaped with a first and a second fork arm, wherein the second limb element is engaged between the first and the second fork arm so as to be coupled with the first limb element. The first limb element may, for example, comprise a main body which continues into at least two fork arms on at least one side. Preferably, the fork arms each comprise a bore, wherein the bores are aligned with one another and are arranged around the shaft element. The fork arms are spaced apart from one another in the axial direction, such that they provide space for the second limb element to engage between them. Preferably, the second limb element also comprises a bore that is arranged around the shaft element and so as to be aligned with the bores in the fork arms, such that the first and the second limb element are pivotably coupled to one another via the shaft element. The second limb element may comprise a extension that is designed such that it can be arranged between the fork arms. For this purpose, the width of the extension may, for example, be adapted to the distance between the fork arms, such that the width is preferably at least 95% of the distance and particularly preferably at least 98%, as a result of which backlash between the fork arms and the second limb element is minimized. The fork arms, for example, offer the advantage that an inclination of the limb element in the axial direction of the shaft element is reduced, since the two fork arms, which are immovable to one another, provide support at two spaced positions.

It is particularly preferred for the first and second limb element to have the same shape, such that both limb elements comprise two fork arms and one extension, which is arranged on the respective limb element spaced apart from the fork arms in the axial direction. In this way, the extension of the second limb element can be arranged in an engaging manner between the fork arms of the first limb element, and the extension of the first limb element can be arranged in an engaging manner between the fork arms of the second limb element. In this case, the shaft element may be arranged in the bores of the extensions and of the fork arms of both limb elements at the same time, such that the first and the second limb element are pivotably coupled at two mutually spaced positions.

In an advantageous further development, the platform is laterally adjustable at least in part in a lateral direction transversely to the height direction. For this purpose, the platform may preferably be divided into sections that are laterally adjustable at least in part. For example, at least one section may be attached to the support elements in a stationary manner and another section may be designed to be laterally adjustable. The lateral-adjustable section may be movably connected to the first and/or second support element or to the stationary section. For this purpose, the lateral-adjustable section may, for example, be mounted so as to be displaceable on rails or be mounted on rollers. Preferably, the lateral adjustable section is attached on an eccentrically mounted roller that is arranged so as to engage in a recess, such that said roller, rolling in the lateral direction inside the recess, can move the lateral-adjustable section along with it in a linear manner. Preferably, an actuation element that is designed to adjust the lateral-adjustable section is attached to the platform. For example, the actuation element may be a slide that pushes the lateral-adjustable section on rails. Furthermore, the actuation element may, for example, be a crank or a rotary knob for setting the rollers or the eccentrically mounted roller in motion. The platform may comprise multiple lateral-adjustable sections that can be moved independently of one another. In this connection, the platform may be laterally adjustable in one or more directions transversely to the height direction, such that the platform can enable individually adaptable positioning of workpieces in a process chamber, for example.

According to a preferred embodiment, at least the first and the second limb element of the first and/or second support element consist of graphite. The limb elements may be composed of multiple sections consisting of graphite, or preferably be integrally formed. On account of its low coefficient of friction, graphite as the material for the limb elements has a particularly positive effect on the ability of the closely abutting limb elements to move in a sliding manner, thus dispensing with the need for lubrication, for example. The low coefficient of friction of graphite is also advantageous for other components of the holding device that move relative to one another while abutting one another. For example, if two components move relative to one another while abutting one another, one can consist of graphite and the other of another material, such as stainless steel. Particularly preferably, both components consist of graphite. Thus, in addition to the limb elements, the platform, to which the support elements may be pivotably attached and which may be movable laterally, may also consist of graphite. Equally, the standing surface, which is pivotably connected to the support elements, may also consist of graphite. In this way, the surface properties of graphite advantageously improve the pivotability of the support elements.

The components manufactured from graphite may, for example, be pressed into their shape from graphite powder. Preferably, they are manufactured in one piece from graphite plates, for example by means of milling.

Moreover, graphite offers the advantage that its shape changes only very slightly under the influence of temperature gradients and temperature fluctuations, on account of its low coefficient of expansion. The holding device may preferably be used in a process chamber for coating methods, in particular for plasma-assisted coating methods at temperatures in the high temperature range. "High temperature range" should be understood to mean a temperature range with temperatures above 300° C., preferably above 400° C. In this connection, uniform temperatures may prevail in the entire process chamber, there preferably being a temperature gradient between an immediate surroundings of the workpiece and the floor of the process chamber, for example. Said temperature gradient may, for example, be between a temperature from the high temperature range and room temperature, to which the holding device is subjected. Equally, the holding device may be subjected to a large number of large temperature fluctuations if, for example, it is used for a large number of coating processes carried out at high temperatures. The holding device is subjected to a large temperature fluctuation if the temperature inside the process chamber is lowered between the two coating processes and/or if the holding device is removed from the process chamber.

The property of graphite having a low coefficient of expansion thus offers the advantage that the components consisting of graphite, for example the limb elements, warp only slightly under the influence of temperature gradients and temperature fluctuations, as a result of which, for example in the case of a tight fit, the components neither exert pressure on one another nor cause to have backlash between them. When used for a large number of coating methods, the low warpage and low frictional effects have an advantageous effect on the holding device, since the risk of movements of the components being restricted due to galling is kept low. As such, graphite as the material can be advantageous for the service life of the holding device, since the shape of the holding device is only slightly affected even in the event of a high cycle number of the coating processes.

A holding device substantially consisting of graphite is particularly advantageous for carbon-based deposition processes, for example for hot-wire-activated CVD coating processes, since it has only a minor effect on the atmosphere in the process chamber.

The above-described aspect of making mutually moving components of a holding device for holding workpieces in a process chamber out of graphite can therefore also prove advantageous when considered in isolation.

According to an alternative aspect of the invention, a device for holding workpieces in a process chamber according to claim 15 comprises a platform for the workpieces and a height-adjustable support element for the platform, wherein the support element comprises at least two elements that can move relative to one another and that are in contact with one another and that consist of graphite. The above-described advantages that result from the features according to claim 9 for the first aspect of the invention also apply to this alternative aspect of the invention.

In a preferred embodiment, the first and/or the second support element comprises a third and fourth limb element in addition to the first and second limb element, wherein the third and fourth limb element are coupled so as to be pivotable relative to one another about a pivot axis, and wherein the pivot axis of the third and fourth limb element is arranged in parallel with and at a distance from the pivot axis of the first and second limb element. Preferably, the third limb element is designed in the same way as the first limb element and the fourth limb element is designed in the same way as the second limb element. Particularly preferably, all four limb elements have the same shape. Furthermore, it is preferred for the third and fourth limb element to be arranged in a mirror-symmetrical manner with respect to the first and second limb element, wherein the plane of symmetry extends in parallel with the pivot axes. The support elements may be arranged relative to one another in various ways. For example, they may be arranged one next to the other. Preferably, their pivot axes form a quadrilateral, particularly preferably a rectangle. Thus, for example, the platform may also be designed as a rectangle and be positioned on the support elements such that the support element are positioned so as to extend substantially along the sides of the platform.

The coating system according to the invention comprises a process chamber having associated coating means for producing a coating on a workpiece, and a holding device as described above that is arranged so as to be adjustable between a first and a second position, wherein the holding device is arranged inside the process chamber in the first position and at least partially outside the process chamber in the second position.

In this regard, the process chamber is preferably designed to be tightly sealable, in order, for example, to enable a state of vacuum. The coating means make it possible, for example, to change the prevailing gas composition, the temperature and/or the pressure in the process chamber, in order to enable coating methods. For example, the coating means comprise a vacuum pump, one or preferably multiple gas supplies, heating devices, a device for evaporating matter and/or a device for enabling surface reactions on workpieces, for example devices for igniting plasma or for heating the workpiece surfaces to more than 150° C. Under these conditions, a coating can be applied to a workpiece, for example in order to improve the stability, hardness or longevity of workpieces. For this purpose, hard and stable materials may preferably be deposited to the workpiece, such as crystalline materials and preferably diamond.

In the first position, the holding device is located inside the process chamber. Preferably, said holding device is located completely in and enclosed by the process chamber, such that it is exposed to a defined coating atmosphere. Preferably, the holding device is immovable in the first position, such that tools held thereby move as little as possible.

In the second position, the holding device is located at least partially outside the process chamber, such that it can be equipped particularly easily with workpieces to be coated or coated workpieces can be removed.

According to a preferred embodiment of the coating system according to the invention, the holding device is displaceable mounted on at least one roller manufactured from graphite for the adjustment between the first and the second position. The roller may be attached underneath or on the side of the holding device, for example it may be arranged on the support elements. Preferably, a base plate is arranged between the support elements and the roller. Particularly preferably, the base plate has the same shape as the platform, for example a rectangular shape. Mounting the holding device on the roller enables a simple and safe displacement between the first and second position. In addition, the roller as an adjustment system can be implemented in a simple manner and with few components. Manufacturing the roller from graphite offers the above-described advantages of graphite for components that are attached and move relative to other components. Particularly preferably, the holding device is mounted on multiple rollers, particularly preferably on four rollers which may, for example, be attached to the four outer corners of a rectangular base plate.

According to a preferred development of the coating system according to the invention, the coating means comprise filaments, i.e. wires, which are designed such that a current flows through them in order to heat them. Preferably, they are designed to reach temperatures of above 150° C., particularly preferably above 1000° C. When the filaments are close to the surface of a workpiece, they heat said surface, preferably in order to thus enable surface reactions in order to chemically deposit layers, particularly preferably diamond layers, from a gaseous phase of a solid component, on the workpiece. Furthermore, the filaments are designed, for example, to split hydrogen gas into free radicals, which can then react with carbonaceous gas in order to deposit carbon in diamond form on the workpiece.

In order to enable heating of the surface of the workpiece and in order to activate the hydrogen gas close to the surface, the filaments are preferably arranged in the process chamber such that in the first position the height of the platform can be adjusted relative to the filaments. For this purpose, the filaments are attached in the process chamber above the platform, such that, by adjusting the height of the platform, the filaments and the platform can be moved toward one another or away from one another, such that workpieces of different sizes can be arranged on the platform and, at the same time, close to the filaments. Preferably, the filaments are attached in the process chamber such that they are oriented perpendicularly to the platform. Preferably, multiple filaments that are attached within a plane in parallel with one another are located in the process chamber. Particularly preferably, two planes with filaments are arranged in parallel with one another. This attachment of the filaments proves particularly advantageous for the two-sided heating of workpieces of which the height extent dominates, since a workpiece can be positioned, for example, between the planes of filaments.

Figure 2:
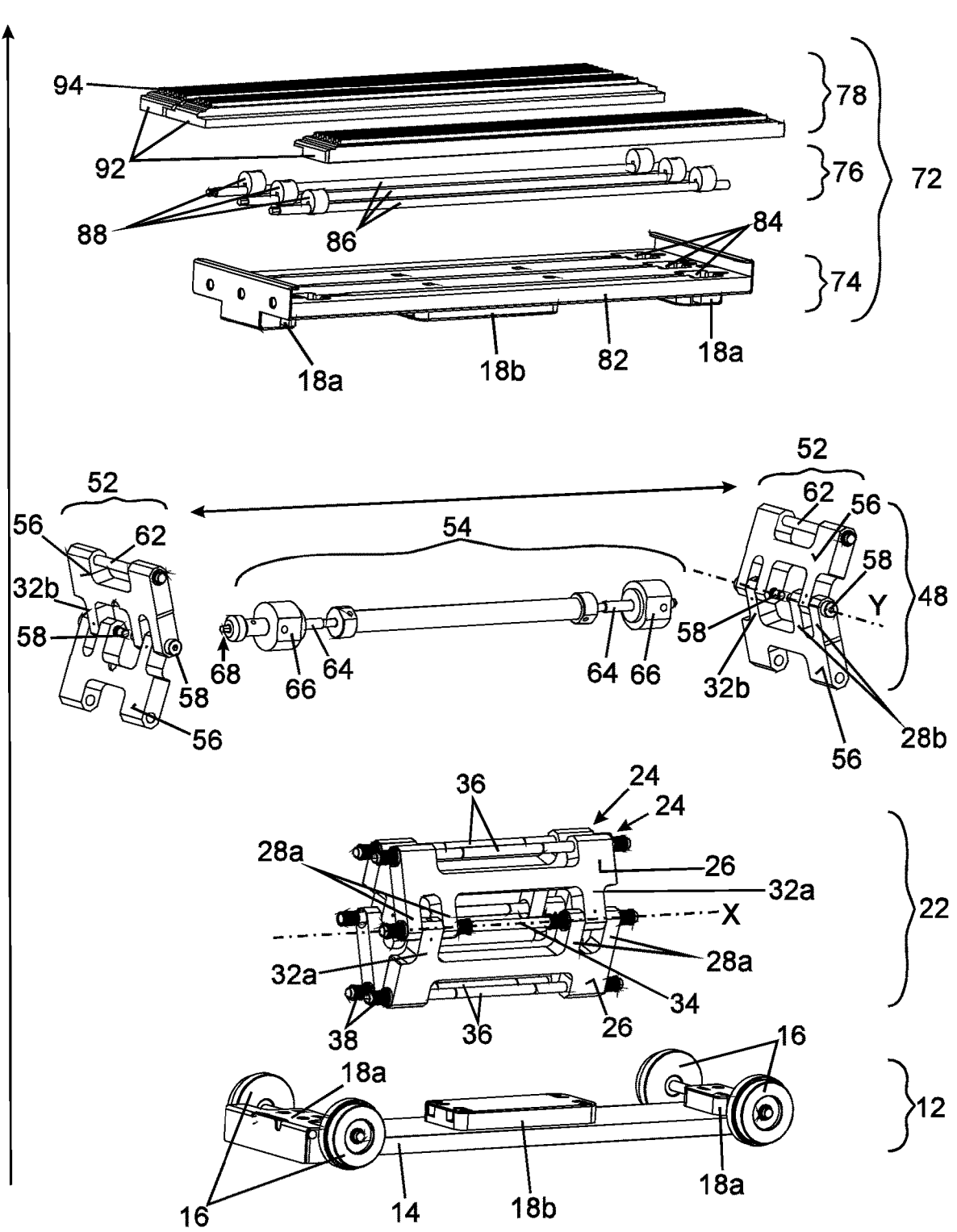
Figure 3:
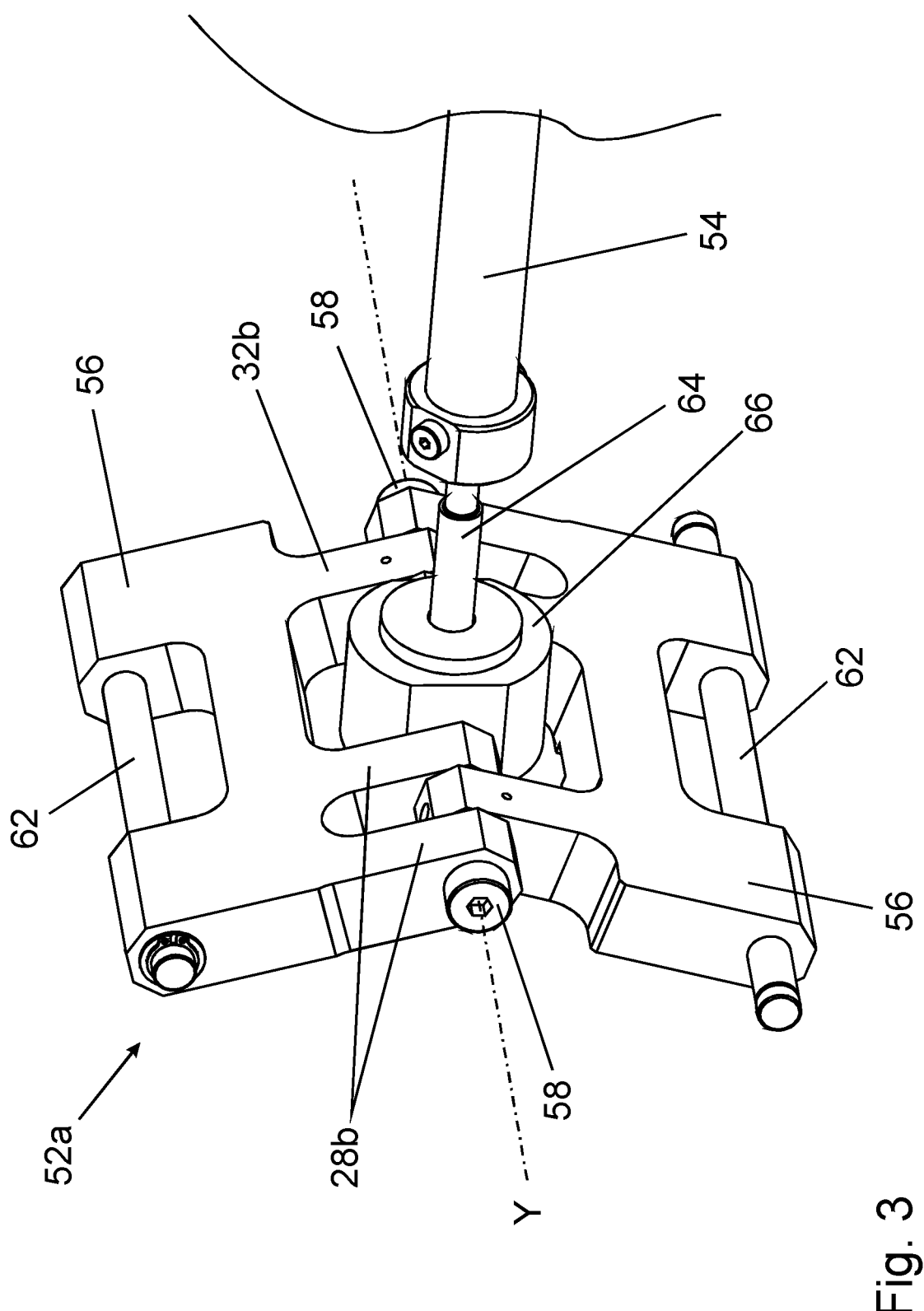
Figure 4:
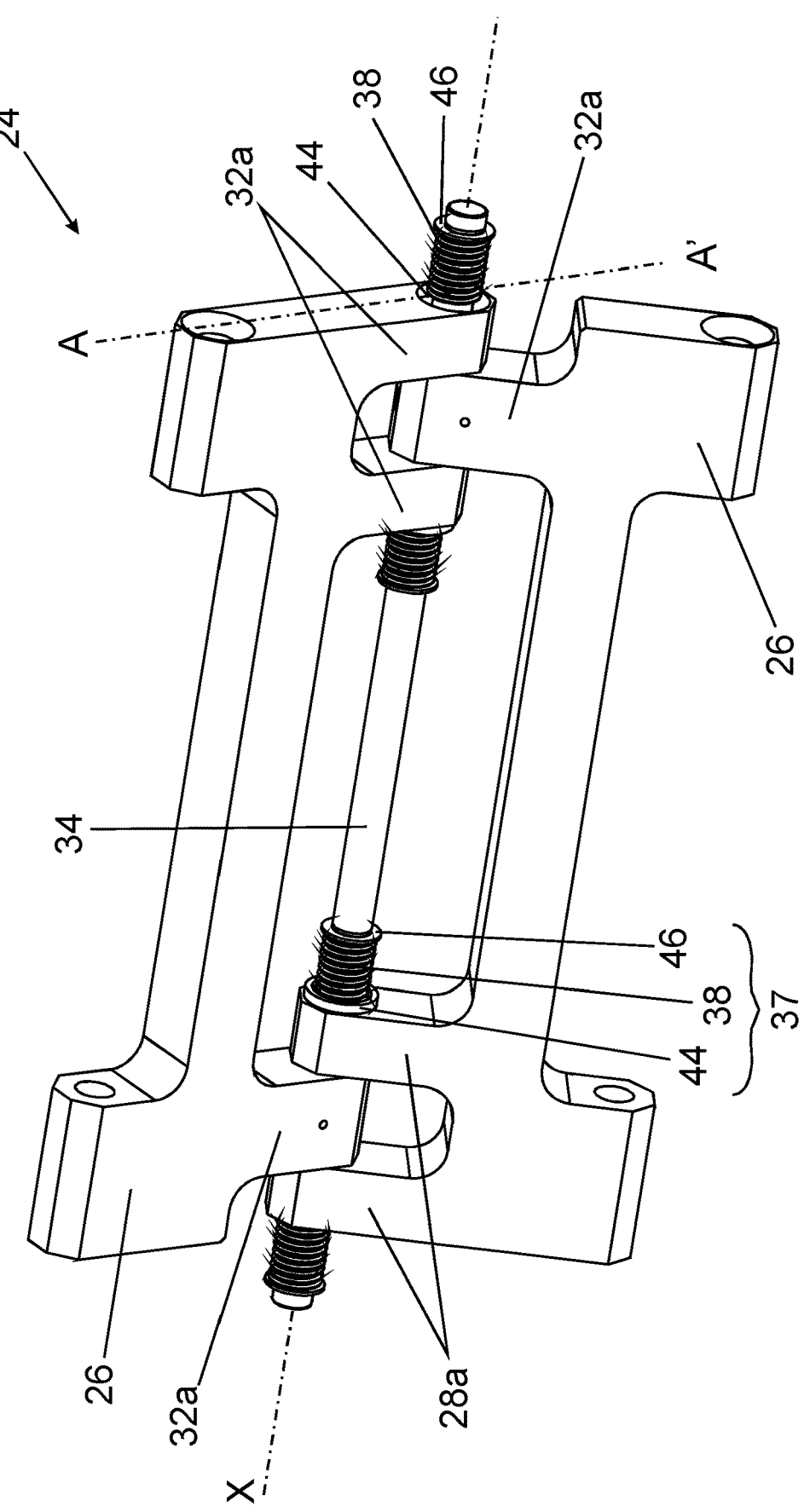

Exemplary embodiments of the invention are explained in more detail below with reference to drawings. The figures show:

FIG. 1 a perspective view of a first exemplary embodiment of a holding device, FIG. 2 an exploded view of the holding device according to FIG. 1, FIG. 3 a perspective view of a support element of the holding device according to FIGS. 1 and 2, FIG. 4 a perspective view of further support element of the holding device according to FIG. 1-3, FIG. 5 a partial section along the section line A . . . A' in FIG. 4, FIG. 6 a sectional view of a limb element along the section line A . . . A' in FIG. 4, FIG. 7, 8 partial schematic representations of a coating system having a holding device according to FIG. 1-6 in a front and side view.

FIG. 1 shows a first exemplary embodiment of a device for holding workpieces 10, in the following referred to as a holding device 10, comprising a substructure 12, a first and a second height-adjustable support element 22, 48, and a platform 72.

The support elements 22, 48, which support the platform 72, are fastened to the substructure 12.

FIG. 2 shows the holding device 10 from FIG. 1, wherein the components shown have been displaced in the directions of the arrows for the exploded view.

The substructure 12 consists of a base plate 14 and four rollers 16. The base plate 14 is a rectangular, planar graphite plate having two longitudinal sides and two short sides. Three metal fastening blocks 18a, 18b are mounted on the upper side of the base plate on both short sides as well as centrally for mounting the rollers 16 and the support elements 22, 48. The four rollers 16 are connected so as to be rotatable and, for this purpose, are each connected in pairs by means of a shaft. In each case, one shaft is attached in a fastening block 18a on a short side of the base plate 14.

The first support element 22 comprises two longitudinal support units 24 designed so as to be mirror-symmetrical, of which one is shown in FIG. 4, and comprising two longitudinal limb elements 26 and a shaft element 34.

The longitudinal limb elements 26 are each cut from a rectangular graphite plate, such that they have extensions on their longitudinal sides. Two fork extensions 28a are positioned close together so as to form a fork. A single extension 32a is arranged at a distance from the fork on the same long side.

In each case, two longitudinal limb elements 26 are coupled via the shaft element 34, in that, in each case, one single extension 32a engages between the fork extensions 28a and the shaft element 34 extends in aligned bores through the extensions 28a, 32a of both longitudinal limb elements 26. In this way, both longitudinal limb elements 26 are coupled so as to be pivotable about a longitudinal pivot axis X, in that they are interconnected in an articulated manner via the shaft element 34 arranged along the longitudinal pivot axis X, such that the angle included between them can be changed.

Two longitudinal fastening axes 36 extend through the outer longitudinal sides of both longitudinal support units 24 for pivotably attaching the first support element 22 to the substructure 12 and to the platform 72.

Axial clamping units 37, for each of which a cone 44, an axial spring 38 and a locking ring 46 cooperate, are attached to the shaft element 34 and to the longitudinal fastening axes 36. The axial clamping units 37 are, on the one hand, attached on the shaft element 34 on both outer sides of both forks (see FIG. 4) and, on the other hand, attached on the longitudinal fastening axes 36 on the outer sides of the longitudinal limb elements 26 (see FIG. 2). The axial clamping units 37 preload the articulated connections of the longitudinal limb elements on the shaft element 34 and on the longitudinal fastening axes 36 in the axial direction.

The second support element 48 comprises two transverse support units 52, which are designed to be mirror-symmetrical, and an adjustment element 54. In this regard, FIG. 3 shows a transverse support unit 52 and part of the adjustment element 54 connected thereto. The adjustment element 54 is designed to be symmetrical and the second transverse support unit 52 is attached thereto in a mirror-symmetrical manner. The transverse support units 52 each comprise two transverse limb elements 56, which are identical and also provided as graphite plates. Analogous to the longitudinal leg elements 26, two fork extensions 28b and a single extension 32b are located on their longitudinal sides.

Two screws 58 are attached along a transverse pivot axis Y so as to be spaced apart from one another in the axial direction such that two fork extensions 28b are pivotably coupled to one single extension 32b via one screw 58 in each case.

The adjustment element 54 is designed as a spindle and, on each of both sides, comprises a spindle thread 64, which engages with a threaded nut 66 in each case. In addition, a coupling element 68 (see FIG. 2) is located on one side of the adjustment element 54 in order, for example, to rotate the spindle 54 with a wrench.

The threaded nut 66 is coupled to the transverse support unit 52 in that it is arranged between the two forks of the transverse support unit 52 and is screwed from both sides by means of the screws 58. The threaded nut 66 lies on the transverse pivot axis Y, such that it is traversed centrally thereby and the axis of the adjustment element 54 is aligned perpendicularly to the axis Y. One of the two threaded nuts 66 comprises a clockwise thread and the other comprises an anticlockwise thread, such that their movements are opposed during rotation of the adjustment element 54 and they move toward one another or away from one another.

Two transverse fastening shafts 62 extend through the outer longitudinal sides of both transverse support units 52 for pivotably attaching the second support element 48 to the substructure 12 and to the platform 72.

The platform 72 comprises a fastening unit 74, an actuation unit 76 and a supporting unit 78. The supporting unit 78 lies on top on the fastening unit 74 and both enclose the actuation unit 76 within their interior.

The fastening unit 74 comprises a planar, rectangular fastening plate 82, which is manufactured from a graphite plate. It comprises three elongate recesses 84, which extend in parallel with its longitudinal sides. On the lower side of the fastening plate 82, analogous to the base plate 14, two fastening blocks 18a are located on the short sides and one fastening block 18b is located in the center of the fastening plate 82.

The actuation unit 76 comprises three identical eccentric shafts 86, at the ends of which one eccentric 88 is attached in each case. All six eccentrics 88 also have the same shape.

The supporting unit 78 is composed of three individual, planar, rectangular supporting plates 92, which are also manufactured from graphite plates and have recesses in longitudinal directions on their lower side (not shown). There are multiple ridges on all three supporting plates 92 so as to form guide grooves 94 in the longitudinal direction.

The actuation unit 76 lies in the recesses of the fastening unit 84 and of the supporting unit 78, such that the eccentric shafts 86 can rotate and the eccentrics 88 can carry out rotational and linear movements. In each case, one supporting plate 92 lies on one eccentric shaft 86 having two eccentrics 88, such that the eccentric shaft 86 and the eccentrics 88 are located inside the recesses of the supporting plate 92. A rotation of one of the eccentric shafts 86 can therefore adjust the supporting plate 92 resting thereon relative to the fastening plate 82 in the transverse direction.

The substructure 12, the two support elements 22, 48 and the platform 72 are interconnected via the longitudinal and transverse fastening shafts 36, 62, which are rotatably mounted in fastening blocks 18a, 18b (see FIG. 1). For both longitudinal support units 24 and both transverse support units 52, in each case, one longitudinal fastening axis 36 and one transverse fastening shaft 62, respectively, are attached in an articulated manner, in a fastening block 18*a*, 18*b* on the base plate 14 and in a fastening block 18*a*, 18*b* on the fastening plate 82.

The platform 72, which is aligns in parallel with the substructure 12, can be adjusted in height by means of the second support element 48. For this purpose, its height is adjusted by means of the adjustment element 54 such that it changes the distance between the substructure 12 and the platform 72.

The height adjustability of the second element 48 is implemented by means of a toggle joint. Three shafts, i.e. the transverse pivot axis Y and the two transverse fastening shafts 62, are interconnected in an articulated manner via the transverse limb elements 56. The transverse limb elements 56 are coupled to one another and to the adjustment element 54 in the transverse pivot axis Y such that the adjustment element 54 can displace the transverse pivot axis Y translationally transversely to the direction of the height adjustment and can thus bow or stretch the articulated connection of the transverse limb elements 56. In this way, the substructure 12 and the platform 72 remain aligned and parallel to one another during height adjustment.

Figure 5:
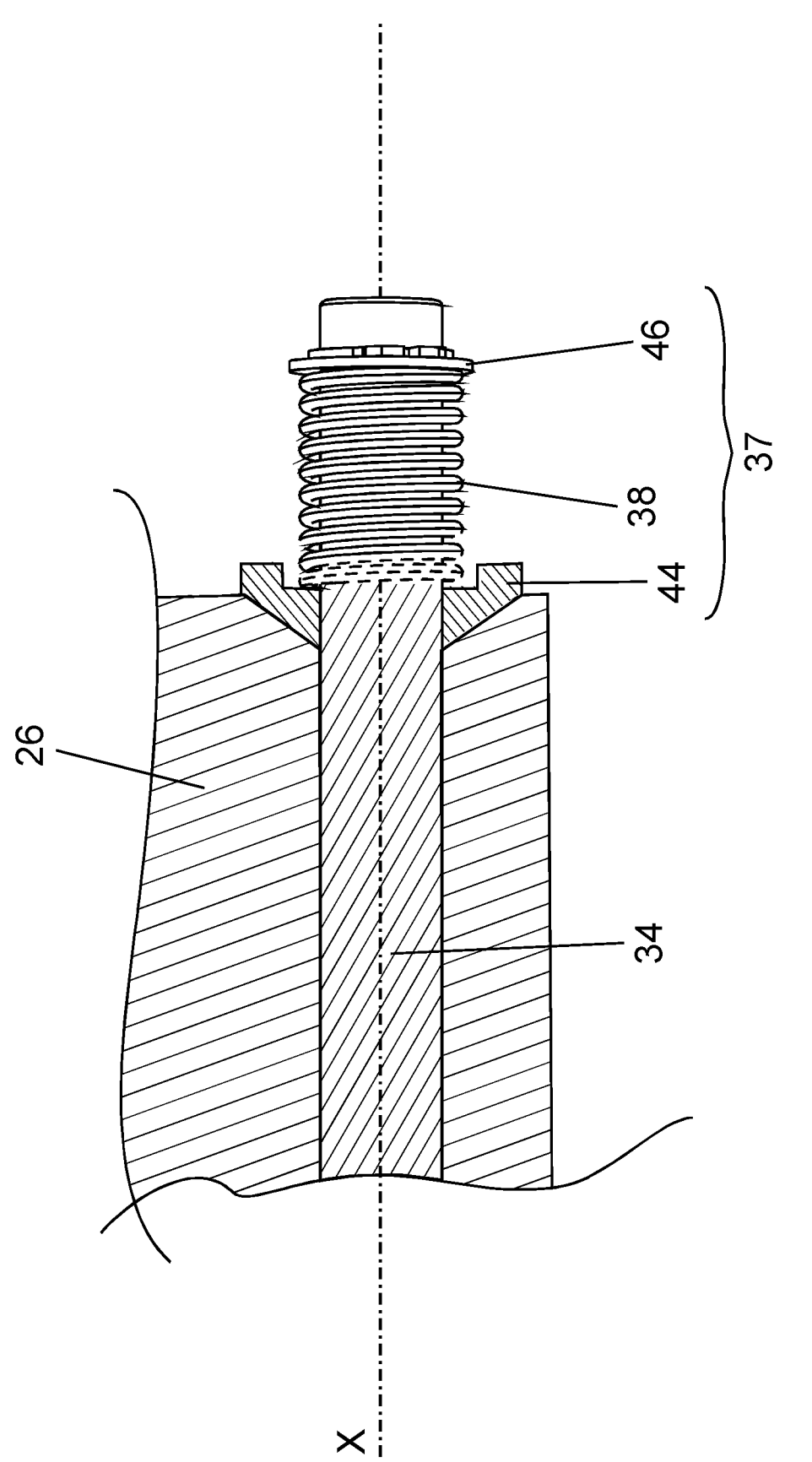

FIG. 5 shows a section of one of the two longitudinal limb elements 26 with the axial clamping unit 37. The cone 44 comprises a bore, which is adapted to the shaft element 34 such that the cone 44 abuts with a tight fit therearound. Furthermore, the tapered section of the cone 44 lies in a form-fitting manner in a likewise tapered material recess of the longitudinal limb element 26, such that said cone is partially enclosed by the longitudinal limb element. Outside of the longitudinal limb element 26, in crosssection, the cone 44 comprises a notch, in which said cone receives the axial spring 38 in order to hold same and thus to ensure an optimal transmission of force from the axial spring 38 to the longitudinal limb element 26. The other end of the axial spring 38 is held by an immovable locking ring 46. The axial spring 38 is preloaded between the cone 44 and the locking ring 46 such that it exerts a force in the direction of the axis X. Two axial clamping units 37 clamp the fork on both sides and center the shaft element 34 in the bores of the longitudinal limb element 26 (see FIG. 4). In this way, the backlash of the longitudinal limb elements 26, in particular in the direction of the axis X, is reduced and the friction at the joint formed by the two longitudinal limb elements 26 is increased, such that the inertia of the movements of the longitudinal limb elements 26 is increased.

Figure 6:
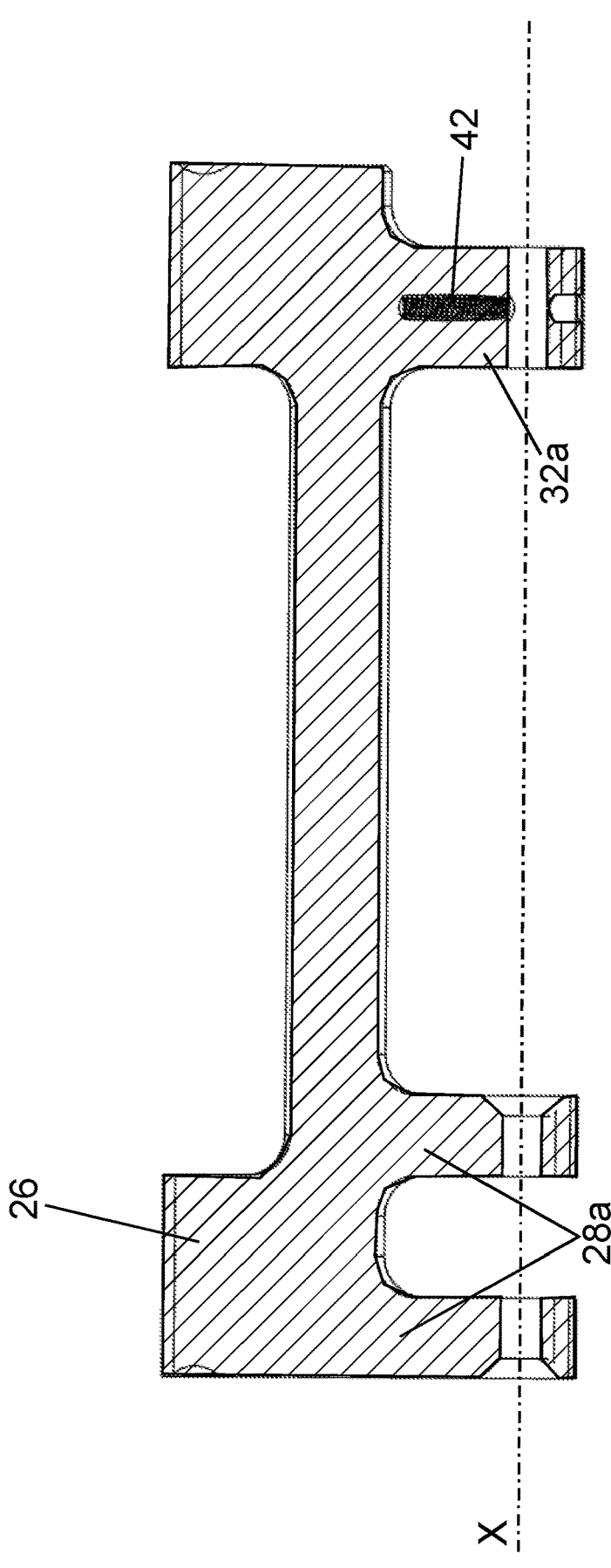

FIG. 6 shows the arrangement of a radial spring 42 inside the longitudinal limb element 26, more specifically in the single extension 32*a*. It is attached in a bore that is oriented perpendicularly to the axis X and thus acts between the longitudinal limb element 26 and the shaft element 34. Due to it being preloaded, it also reduces the backlash and increases the friction. For the longitudinal support unit 24, a radial spring 42 is mounted in both longitudinal limb elements 26 so that they act on the shaft element 34 from opposite directions.

Radial springs 42 are also inserted in the single extensions 32*a* of the second support element 48 in the same way (not shown).

The first support element 22 has no height-adjusting effect for the holding device 10, but rather merely a supporting effect along the longitudinal side of the platform 72. The second support element 48, in addition to its height-adjusting effect, also has a supporting effect along the transverse sides of the platform 72. As such, the supporting forces are directed at a right angle to one another and increase the range of the directions in which backlash is reduced. The spacing between the longitudinal support units 24 and between the transverse support units 52, and the damping of the movements of the first support element 22 result in a stable hold of the platform 72 without wobbling.

Figure 7:
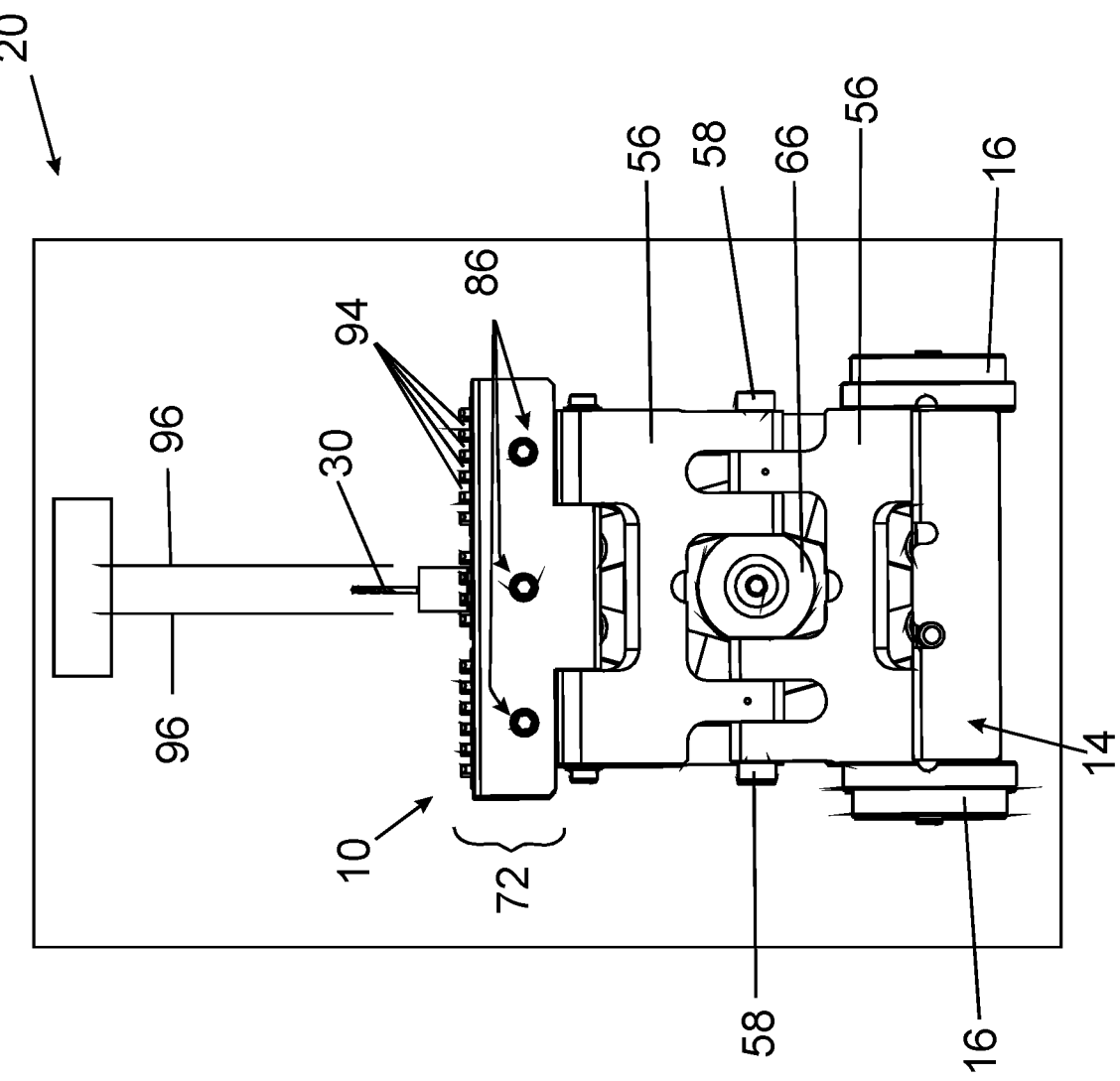
Figure 8:
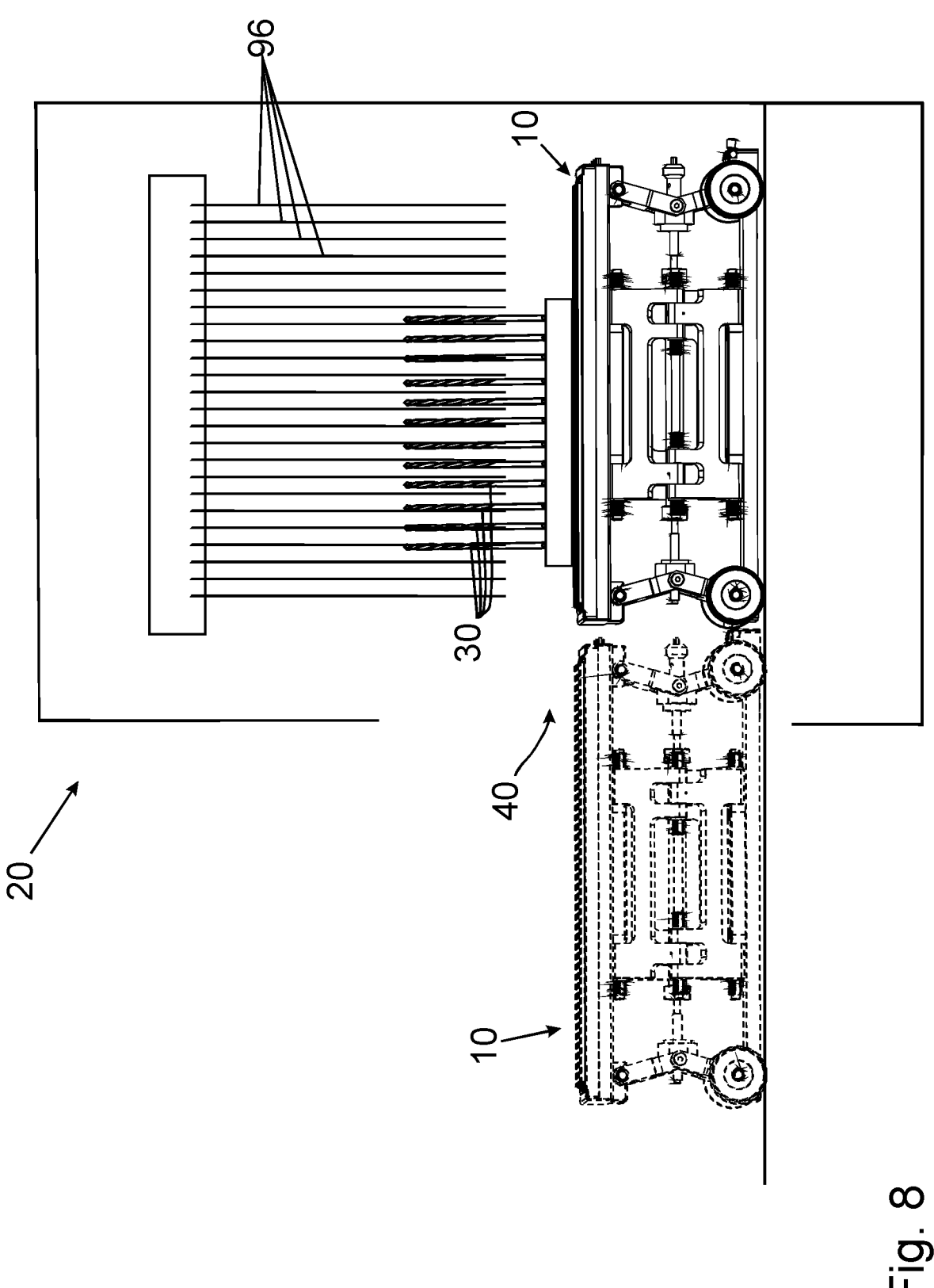

FIGS. 7 and 8 schematically show how the holding device 10 can be used in a coating system 20.

The coating system 20 is designed for hot-wire-activated CVD coating methods. Filaments 96 are attached in two mutually parallel planes and are aligned perpendicularly to the platform 72.

FIG. 7 shows a row of workpieces 30 that are being held by the holding device 10 between the two planes of filaments 96. The guide grooves 94 hold a workpiece holder with the workpieces 30 firmly in an upright position. On account of the above-mentioned height and lateral adjustability, the workpieces 30 can be precisely positioned such that they are arranged exactly between the two planes and are subjected to the localized high temperatures of, for example, 600° C. locally generated by means of the filaments. Workpieces may also be arranged on the other supporting plates 92.

In order to mount the workpieces 30 on the holding device 10 or to remove them after a coating process, the holding device 10 is located in an equipping position and is rolled out of the coating system 20 on a pull-out base for this purpose. In order to coat the workpieces 30, the holding device 10 is fully rolled into the inside of the coating system 20 and is located in a coating position. The pull-out base is also pushed in. On account of the arrangement of the support elements 22, 48 and the preloading of the articulated connections, a switch between the equipping and the coating position takes place with movements involving little backlash.

LIST OF REFERENCE SIGNS

10 Holding device
12 Substructure
14 Base plate
16 Roller
18*a, b* Fastening blocks
20 Coating system
22 First support element
24 Longitudinal support unit
26 Longitudinal limb element
28*a* Fork extensions of the first support element
28*b* Fork extensions of the second support element
30 Workpiece
32*a* Single extension of the first support element
32*b* Fork extensions of the second support element
34 Shaft element
36 Longitudinal fastening axis
37 Axial clamping unit
38 Axial spring
42 Radial spring
44 Cone
46 Locking ring
48 Second support element
52 Transverse support unit
54 Adjustment element
56 Transverse limb element
58 Screw
62 Transverse fastening shaft
64 Spindle thread
66 Threaded nut
68 Coupling element
72 platform
74 Fastening unit 76 Actuation unit
78 Supporting unit
82 Fastening plate
84 Recess in the fastening plate
86 Eccentric shaft
88 Eccentric
92 Supporting plate
94 Guide groove
96 Filament
98 Junction box
X Longitudinal pivot axis
Y Transverse pivot axis

The invention claimed is:

1. A coating system, comprising
a process chamber having associated coating means for producing a coating on a workpiece,
a holding device for holding the workpiece in the process chamber, comprising
a platform for the workpiece,
a height-adjustable first support element and a height-adjustable second support element for the platform,
wherein each of the support elements comprises at least one first and one second limb element,
wherein the respective first and the respective second limb element are coupled: so as to be pivotable relative to one another about a pivot axis,
and wherein the pivot axis of the first support element is arranged at an angle to the pivot axis of the second support element,
wherein the holding device is arranged so as to be displaceable between a first and a second position and wherein the holding device is arranged inside the process chamber in the first position and at least partially outside the process chamber in the second position,
wherein the holding device comprises at least one pair of rollers for the displacement between the first and the second position,
wherein the rollers are mounted on a transverse fastening shaft, and
wherein the transverse fastening shaft is further arranged for pivotably attaching one of the limb elements of the second support element.

2. The coating system according to claim 1, wherein the first and/or second support element comprises an adjustment element, which is designed to change the height of the first and/or second support element.

3. The coating system according to claim 2, wherein the adjustment element is designed to change a pivot angle between the respective first and second limb element of the first and/or second support element.

4. The coating system according to claim 1, wherein the first and/or second support element comprises at least one axial spring element for applying a force effect in the direction of the respective pivot axis of the first and/or second support element.

5. The coating system according to claim 4, wherein a cone element is arranged around the respective pivot axis of the first and/or second support element, wherein the axial spring element acts on the cone element, one of the first and/or second limb element and the shaft element.

6. The coating system according to claim 1, wherein a shaft element is arranged along the respective pivot axis of the first and/or second support element, and wherein a radial spring element is arranged so as to act radially between one of the first and/or second limb element of the first and/or second support element and the shaft element.

7. The coating system according to claim 1, wherein the first limb element of the first and/or second support element is fork-shaped with a first and a second fork arm,
and wherein the respective second limb element of the first and/or second support element is engaged between the first and the second fork arm so as to be coupled with the respective first limb element of the first and/or second support element.

8. The coating system according to claim 1, wherein the platform is adjustable sideways at least in part in a sideways direction transversely to the vertical direction.

9. The coating system according to claim 1, wherein at least the first and second limb element of the first and/or second support element consists of graphite.

10. The coating system according to claim 1, wherein the first and/or second support element comprises a third and fourth limb element in addition to the first and second limb element,
wherein the third and fourth limb element are coupled so as to be pivotable relative to one another about a pivot axis,
and wherein the pivot axis of the third and fourth limb element is arranged in parallel with and at a distance from the pivot axis of the first and second limb element.

11. The coating system according to claim 1, wherein the roller is manufactured from graphite.

12. The coating system according to claim 1, wherein the coating means comprise filaments, which are arranged in the process chamber such that the height of the platform can be adjusted relative to the filaments in the first position.

13. A method for coating a workpiece, wherein the workpiece to be coated is arranged in a process chamber of a coating system according to claim 1 and is coated by a plasma method.

14. The coating system according to claim 1, wherein the first and/or second support element comprises at least two axial spring elements arranged to act in opposite directions on one of the limb elements.

15. A coating system, comprising
a process chamber having associated coating means for producing a coating on a workpiece,
a holding device for holding the workpiece in the process chamber, comprising
a platform for the workpiece,
a height-adjustable first support element and a height-adjustable second support element for the platform,
wherein each of the support elements comprises at least one first and one second limb element,
wherein the respective first and the respective second limb element are coupled so as to be pivotable relative to one another about a pivot axis, and
wherein the pivot axis of the first support element is arranged at an angle to the pivot axis of the second support element,
wherein the holding device is arranged so as to be displaceable between a first and a second position and wherein the holding device is arranged inside the process chamber in the first position and at least partially outside the process chamber in the second position,

wherein a shaft element is arranged along the respective pivot axis of the first and/or second support element, and wherein a radial spring element is arranged so as to act radially between one of the first and/or second limb element of the first and/or second support element and the shaft element.

\* \* \* \* \*

16